US010529388B2

(12) United States Patent
Fritsch et al.

(10) Patent No.: US 10,529,388 B2
(45) Date of Patent: Jan. 7, 2020

(54) CURRENT-MODE SENSE AMPLIFIER

(71) Applicant: International Business Machines Corporation, Armonk, NY (US)

(72) Inventors: Alexander Fritsch, Esslingen (DE); Michael Kugel, Boeblingen (DE); Juergen Pille, Stuttgart (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/115,736

(22) Filed: Aug. 29, 2018

(65) Prior Publication Data

US 2018/0374517 A1 Dec. 27, 2018

Related U.S. Application Data

(63) Continuation of application No. 15/653,782, filed on Jul. 19, 2017, now Pat. No. 10,096,346, which is a (Continued)

(30) Foreign Application Priority Data

Sep. 4, 2014 (GB) .................................. 1415668.1

(51) Int. Cl.
*G11C 7/06* (2006.01)
*G11C 7/08* (2006.01)
(Continued)

(52) U.S. Cl.
CPC .............. *G11C 7/065* (2013.01); *G11C 5/063* (2013.01); *G11C 7/08* (2013.01); *G11C 7/14* (2013.01); *G11C 7/02* (2013.01)

(58) Field of Classification Search
CPC ...................................................... G11C 7/065
(Continued)

(56) References Cited

U.S. PATENT DOCUMENTS 5,552,728 A 9/1996 Lin
5,903,171 A 5/1999 Shieh
(Continued)

OTHER PUBLICATIONS

Do et al., Design and Sensitivity Analysis of a New Current-Mode Sense Amplifier for Low-Power SRAM, IEEE Transactions on Very Large Scale Integration (VLSI) Systems, 2009 IEEE, pp. 1-10.
(Continued)

*Primary Examiner* — Son L Mai
(74) *Attorney, Agent, or Firm* — Lieberman & Brandsdorfer, LLC

(57) ABSTRACT

A current sense amplifier is provided. The amplifier comprises a first cross coupled inverter, a second cross coupled inverter, and a transmission gate. The first cross coupled inverter has a first source coupled to sense current input. The second cross coupled inverter has a second source coupled to a reference current input. The transmission gate comprises a first transmission end, a second transmission end, and a gate input. The first transmission end is operatively coupled to a first input of the first cross coupled inverter. The second transmission end is operatively coupled to a second input of the second cross coupled inverter. The gate input is operatively coupled to the control line input. Each cross coupled inverter is configured for switching a coupling of the sense current input and the reference current input.

18 Claims, 4 Drawing Sheets

Related U.S. Application Data continuation of application No. 15/245,668, filed on Aug. 24, 2016, now Pat. No. 9,761,286, which is a continuation of application No. 14/840,134, filed on Aug. 31, 2015, now Pat. No. 9,552,851.

(51) Int. Cl.

*G11C 7/14* (2006.01)
*G11C 5/06* (2006.01)
*G11C 7/02* (2006.01)

(58) Field of Classification Search

USPC .............................................. 365/205; 327/55
See application file for complete search history.

(56) References Cited

U.S. PATENT DOCUMENTS

| | | | | |
|---|---|---|---|---|
| 5,929,659 | A * | 7/1999 | Pantelakis .............. | G11C 7/062 327/55 |
| 6,317,359 | B1 | 11/2001 | Black et al. | |
| 6,396,309 | B1 | 5/2002 | Zhao et al. | |
| 6,717,876 | B2 | 4/2004 | Vlasenko et al. | |
| 6,980,461 | B2 | 12/2005 | Portmann et al. | |
| 7,084,671 | B1 | 8/2006 | Wendell et al. | |
| 7,619,935 | B2 | 11/2009 | Kim et al. | |
| 8,411,490 | B2 | 4/2013 | Lawson et al. | |
| 8,503,252 | B2 | 8/2013 | Siao | |
| 8,514,645 | B2 | 8/2013 | John | |
| 8,742,796 | B2 | 6/2014 | Dally et al. | |
| 8,750,018 | B2 | 6/2014 | Youn et al. | |
| 8,854,868 | B2 | 10/2014 | Cao et al. | |
| 2004/0008068 | A1 | 1/2004 | Kim | |
| 2011/0255359 | A1 | 10/2011 | Sachdev et al. | |
| 2012/0300566 | A1 | 11/2012 | Mueller et al. | |

OTHER PUBLICATIONS

Teng, Design of a Low-Power and High Performance Current Sense Amplifier, Nanyang Technological University, Singapore, Abstract, 2009.
List of IBM Patents or Applications Treated as Related, Aug. 2018.
Jul. 19, 2017, U.S. Appl. No. 15/653,782, 2017-0316812.
Aug. 24, 2016, U.S. Appl. No. 15/245,668, 2016-0365130.
Aug. 31, 2015, U.S. Appl. No. 14/840,134, 2016-0072461.

* cited by examiner

| | TRU | CMP | IN | IN_INV | OUT_1 | OUT_2 |
|---|---|---|---|---|---|---|
| PHASE 1 | | | 1 | 0 | 1 | 1 |
| PHASE 2 MISS | 1 | 0 | 0 | 1 | 0 | 1 |
| PHASE 2 MATCH | 0 | 1 | 0 | 1 | 1 | 0 |

CURRENT-MODE SENSE AMPLIFIER

CROSS-REFERENCE TO RELATED APPLICATION

This application is a continuation patent application claiming the benefit of the U.S. patent application Ser. No. 15/653,782, filed on Jul. 19, 2017, and titled "Current-Mode Sense Amplifier" now pending, which is a continuation of Ser. No. 15/245,668, filed on Aug. 24, 2016, and titled "Current-Mode Sense Amplifier" now U.S. Pat. No. 9,761, 286, which is a continuation patent application claiming the benefit of the U.S. patent application Ser. No. 14/840,134, filed on Aug. 31, 2015, and titled "Current-Mode Sense Amplifier" now U.S. Pat. No. 9,552,851, which claims priority under 35 U.S.C. § 119 from Great Britain Patent Application No. 1415668.1 filed on Sep. 4, 2014, the entire contents of the applications are incorporated herein by reference.

BACKGROUND

Several techniques may be implemented to read data in a memory cell. For instance a current sense amplifier may be used for reading the data stored in the memory cell. In this regard, the current sense amplifier may compare a cell current to a reference current. The reference current may be a current of a reference memory cell. When the memory cell is coupled to the current sense amplifier via a bit line it causes two different currents flowing in the bit line depending on a logical value ("0" or "1") stored in the memory cell. Based on comparison of the current in the bit line against the reference current the current sense amplifier determines the logical value stored in the memory cell. The choice of current sense amplifiers for reading data stored in the memory cells is determined by the fact that the bit lines have high capacitance. Thus evaluation of currents flowing in the bit lines enables faster operation of digital circuitry in comparison with the case when evaluation of voltages is used for reading of data stored in the memory cells.

SUMMARY

The present embodiments include current sense amplifiers and an electronic circuit comprising static memory cells and the current sense amplifier.

In one aspect, a current sense amplifier is provided. More specifically, the amplifier comprises a first cross coupled inverter coupled to a sense current input terminal, a second cross coupled inverter coupled to a reference current input terminal, a first amplifier output terminal coupled to the first cross coupled inverter, a second amplifier output terminal coupled to the second cross coupled inverter, and a control line input terminal coupled to the first cross coupled inverter and the second cross coupled inverter. The control line input shifts the first and second cross coupled inverters between states, e.g. from an unlatched state to a latched state. In the latched state, the first cross coupled inverter measures current transmitted through the sense current input terminal, the second cross coupled inverter measures current transmitted through the reference current input terminal, and the first and second cross coupled inverters compare the two currents. More specifically, the current comparison generates a first output at the first amplifier output terminal, and an inverted second output at the second amplifier output terminal.

In another aspect, an electronic circuit is provided comprising static memory cell(s) and a current sense amplifier. More specifically, the amplifier comprises a first cross coupled inverter, a second cross coupled inverter, first and second amplifier output terminals, and a control line input terminal. The control line input shifts the first and second cross coupled inverters between states, e.g. from an unlatched state to a latched state. In the latched state, the first cross coupled inverter measures current transmitted through the sense current input terminal, the second cross coupled inverter measures current transmitted through the reference current input terminal, and the first and second cross coupled inverters compare the two currents. More specifically, the current comparison generates a first output at the first amplifier output terminal, and an inverted second output at the second amplifier output terminal. The electronic circuit includes at least one static memory cell comprising first data output operatively coupled to the current sense amplifier. The first data output is configured to output data stored in a respective memory cell.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments unless otherwise explicitly indicated.

DETAILED DESCRIPTION

Figure 1:
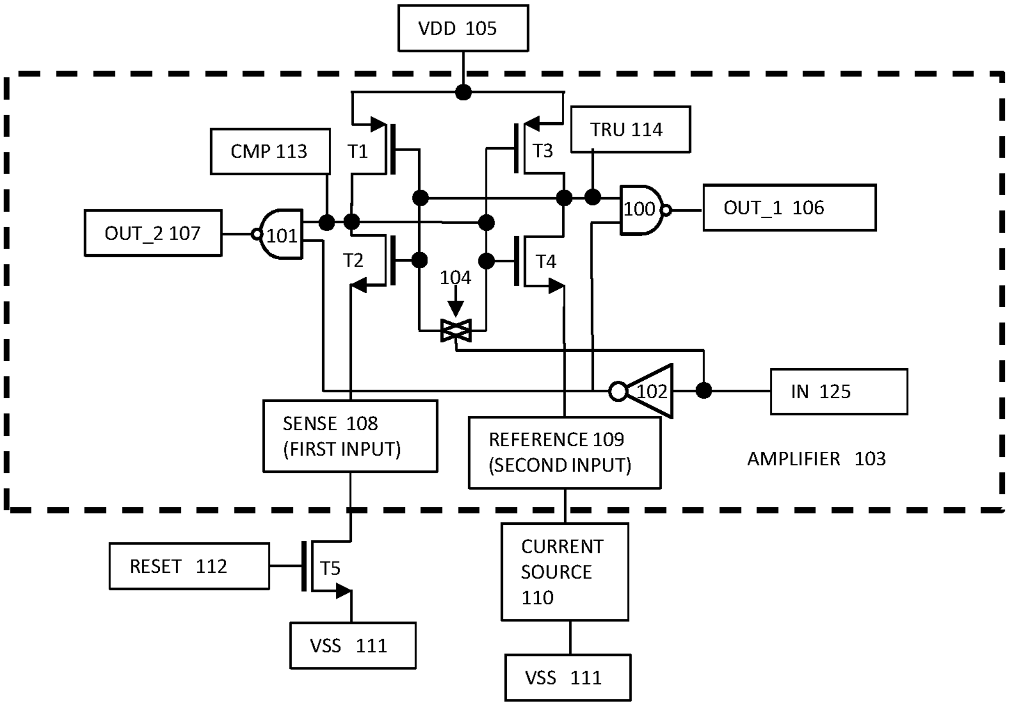
FIG. 1 is a block diagram depicting a circuit diagram of a current sense amplifier.

It will be readily understood that the components of the embodiments, as generally described and illustrated in the Figures herein, may be arranged and designed in a wide variety of different configurations. Thus, the following detailed description of the embodiments of the apparatus, system, and method of the embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Reduction of power consumption and increase in clock frequency are everlasting objectives of digital circuitry development. Achieving this objective comprises solving numerous optimization problems like reduction in peak power consumption and in overall power consumption, reduction of cross-talk between different nodes of circuitry, etc. A current sense amplifier based on a pair of cross-coupled inverters may comprise a current source configured to generate different reference currents. Configuration of the amplifier and coupling circuits (like, for instance, n-FET stacks) enables current limitation in both cases "match" and "mismatch", i.e. when the reference current is lower than the sense current ("mismatch" case) and when the reference current is higher than the sense current ("match" case). The amplifier may be configured in a way that no DC currents, except the leakage currents, are flowing through the amplifier in a steady state. Nodes (input terminals, output terminals) of the amplifier may be decoupled from each other, and, as a result, cross-talk between them is reduced.

In another embodiment, a gate terminal is configured for on/off switching of a coupling between the transmission terminals of the transmission gate. This feature may enable an effective way to drive the cross-coupled inverters out of steady latched state in order to prepare the amplifier for a sensing phase, when the reference and the sense current are compared. Implementation of this feature is another advantage of the amplifier, because the transmission gate may be implemented just by a single transistor.

In another embodiment, the input terminal of the first NAND gate coupled to the control line is coupled to the control line via a further inverter. This feature may prevent a situation in which the output value is undefined at the output terminal of the NAND gate (output terminal of the amplifier), when the amplifier is brought out of steady state. This mechanism will be discussed in greater detail further on below.

In another embodiment, the amplifier comprises a second NAND gate and another output terminal. An output terminal of the second NAND gate is coupled to the other output terminal of the amplifier. One of the input terminals of the second NAND gate is coupled to the to the control line and the other input terminal of the second NAND gate is coupled to the input terminal of the inverter comprising the n-FET having the source coupled to the reference current input terminal. The input terminal of the first NAND gate is coupled to the input terminal of the inverter comprising the n-FET having the source coupled to the sense current input terminal. This embodiment relates to a further advantageous feature of the amplifier which may enable generating a logical value at the second output terminal being logically complimentary of a logical value at the first output terminal when in the sense phase logical values corresponding to either "mismatch" case or "match" case are generated at the output terminals of the amplifier.

In another embodiment, the input terminal of the second NAND gate coupled to the control line is coupled to the control line via the further inverter. This feature may prevent a situation in which an output value is undefined at the output terminal of the second NAND gate (second output terminal of the amplifier), when the amplifier is brought out of steady state. This mechanism will be discussed in greater detail further on in the text.

In another embodiment, the reference current input terminal is coupled to a reference current source. The advantage of this feature may be that a reference current source may be implemented in a numerous ways. For instance it may be implemented by employing the reference current source as a single transistor. This feature may enable a pseudo single-ended current sensing scheme where the reference current source provides the second current required for the differential amplifier. In another embodiment, the reference current source is a programmable current source. The feature may enable tuning of performance the amplifier after it has been manufactured. This tuning functionality enables achieving ultimate performance by compensating variation of electrical properties of transistors over a wafer and/or from wafer to wafer.

In another embodiment, the sense current input terminal is coupled to a further n-FET being configured for on/off switching of a coupling of the sense current input terminal to a ground terminal. This feature may enable more stable operation of the amplifier. The input sense terminal may be coupled to the ground when the cross-coupled inverters are latched. The grounding may enable suppression of parasitic voltage drifts at the sense current input terminal. The grounding may further provide an effective resetting the sense current input terminal to a predefined state in a way that every next operation cycle is not affected by one or more previous operation cycles. In another embodiment, the further n-FET is comprised in a further transmission gate.

In another embodiment, each of the static memory cells comprises a first data output terminal for outputting data stored in the respective static memory cell. The first data output terminal of each the static memory cells is coupled to the sense current input terminal.

In another embodiment, each first data output terminal of the static memory cells is coupled via a respective first n-FET stack to the sense current input terminal. In another embodiment, the first n-FET stacks are connected in a parallel arrangement to ground and the sense current input terminal. Each of the first data output terminals is coupled to a gate of one of the n-FET transistors of the respective first n-FET stacks.

In another embodiment, the reference current input terminal is coupled to a current source configured to generate a current being bigger than zero and lower than a lowest of grounding currents with respect to the first n-FET stacks. The grounding current of an individual first n-FET stack is given by the current that is flowing through the first n-FET stack when all of its transistors are open. This embodiment may enable the operation of the amplifier within a large process parameter space.

In another embodiment, the reference current input terminal is coupled to a current source configured to generate a current being bigger than zero a maximum of a sum of the leakage currents of all first n-FET stacks and lower than a lowest of grounding currents with respect to the first n-FET stacks. The grounding current of an individual first n-FET stack is given by the current that is flowing through the first n-FET stack when all of its transistors are open. A leakage current of an individual first n-FET stack is given by the current that is flowing through the first n-FET stack when at least one of its transistors is closed. This embodiment may enable the operation of the amplifier within a large process parameter space.

In another embodiment each first data output terminal of the static memory cells is further coupled via a respective second n-FET stack to the sense current input terminal. The second n-FET stacks are connected in a parallel arrangement to ground and the sense current input terminal. Each of the first data output terminals is further coupled to a gate of one of the n-FET transistors of the second respective n-FET stacks via a respective inverter. The reference current input terminal is coupled to a current source configured to generate a current being bigger than zero and less than a lowest of grounding currents with respect to the first and second n-FET stacks. The grounding current of an individual first or second n-FET stack is given by the current that is flowing through the first or second n-FET stack when all of its transistors are open. This embodiment may provide for another configuration of coupling of memory cells to the current sense input terminal enable the operation of the amplifier within a large process parameter space.

In another embodiment, each first data output terminal of the static memory cells is further coupled via a respective second n-FET stack to the sense current input terminal. The second n-FET stacks are connected in a parallel arrangement to ground and the sense current input terminal. Each of the first data output terminals is further coupled to a gate of one of the n-FET transistors of the second respective n-FET stacks via a respective inverter. The reference current input terminal is coupled to a current source configured to generate a current being bigger than a maximum of a sum of the leakage currents of all the second n-FET stacks connected to this terminal and less than a lowest of grounding currents with respect to the first and second n-FET stacks. The grounding current of an individual first or second n-FET stack is given by the current that is flowing through the first or second n-FET stack when all of its transistors are open. A leakage current of an individual first n-FET stack is given by the current that is flowing through the first n-FET stack when at least one of its transistors is closed. This embodiment may provide for another configuration of coupling of memory cells to the current sense input terminal enable the operation of the amplifier within a large process parameter space.

In an another embodiment, the first and the second current input terminals are coupled to further n-FETs each being configured for on/off switching of a coupling of the first and the second current input terminal, respectively. This feature may enable more stable operation of the amplifier. The first input terminal and/or the second input terminal may be coupled to the ground when the cross-coupled inverters are latched. The grounding may enable suppression of parasitic voltage drifts at the first and/or second current input terminal. The grounding may further provide an effective resetting the sense current input terminal to a predefined state in a way that every next operation cycle is not affected by one or more previous operation cycles.

FIG. 1 illustrates a circuit diagram of a current sense amplifier (103). The current sense amplifier comprises a reference current input terminal (109), a control line input terminal (125), a sense current input terminal, (108), an output terminal (106), an output terminal (107), a first NAND gate (100), a second NAND gate (101), an inverter (102), a transmission gate (104), and two cross coupled inverters (T1), (T2); (T3), (T4). One of the cross coupled inverters is based on p-FET T1 and n-FET T2. Another one of the cross coupled inverters is based on p-FET (T3) and n-FET (T4). The sources of the n-FETs (T2) and (T4) are coupled to the sense current input terminal (108) and the reference current input terminal (109), respectively.

The transmission gate (104) comprises two transmission terminals and a gate terminal. The gate terminal is coupled to the control line terminal. The gate terminal of the transmission gate is identical to the gate terminal of the n-FET comprised in the transmission gate. The gate terminal of the p-FET comprised in the transmission gate is coupled to the inverted control line terminal (not shown in FIG. 1).

In an alternative implementation the "transmission gate" may only comprise 1 single n-FET or 1 single p-FET coupled the same as in the full transmission gate described above.

Alternatively the amplifier may comprise only one of the two aforementioned NAND gates and only one of the output terminals (106) and (107).

One of the transmission terminals is coupled to an input terminal of one of the inverters and the other transmission terminal is coupled to an input terminal of the other inverter, i.e. one of the transmission terminals is coupled to gates of the transistors (T1) and (T2) (input of one of the cross coupled inverters) and drains of transistors (T3) and (T4) (output of another one of the cross coupled inverters), another one of the transmission terminals is coupled to gates of the transistors (T3) and (T4) (input of the one of the cross coupled inverters) and drains of transistors (T1) and (T2) (output of the other one of the cross coupled inverters). Sources of the transistors (T1) and (T3) are coupled to power terminal VDD (105).

One input of the NAND gate (100) is coupled via node TRU (114) to the output of the inverter comprising transistors (T3) and (T4). Another input of the NAND gate (100) is coupled to an output of the inverter (102). One input of the NAND gate (101) is coupled via node CMP (113) to the output of the inverter comprising transistors (T1) and (T2). Another input of the NAND gate (101) is coupled to an output of the inverter (102). An output terminal of the NAND gate is coupled to the output terminal (106). An output terminal of the NAND gate (101) is coupled to the output terminal (107).

An input of the inverter (102) is coupled to the control line input terminal (125). The sense current input terminal (108) may be further coupled to ground terminal VSS 111 via n-FET transistor (T5) or via another transmission gate comprising the transistor (T5).

A drain of the transistor (T5) (one transmission terminal of the another transmission gate) is coupled to the sense current input terminal and a source of the transistor (T5) (another transmission terminal of the another transmission gate) is coupled to the ground terminal VSS (111). A gate of the transistor (T5) (a gate of the another transmission gate) is coupled to a reset input terminal (112).

The reference current input terminal is coupled to ground terminal VSS (111) via a current source (110). One output terminal of the current source (110) is coupled to the reference current input terminal (109) and the other output terminal of the current source is coupled to the ground terminal VSS (111). The sense current input terminal may be used for coupling of memory cells to it. The memory cells may be coupled to the sense input current terminal via respective n-FET stacks each. The current sense amplifier is configured to generate a logical value on the output terminal (106) and the logical value in an inverted form on the output terminal (107) when an electrical current flowing through the reference current input terminal is higher than an electrical current flowing through the sense current input terminal.

The current sense amplifier is further configured to generate the logical value on the output terminal (107) and the logical value in an inverted form on the output terminal (106) when an electrical current flowing through the reference current input terminal is lower than an electrical current flowing through the sense current input terminal.

The current source (110) may be a fixed current source based on a single FET transistor. Alternatively the current source (110) may be a programmable current source. For instance, the programmable current source may be implemented using a current mirror scheme.

Figure 2:
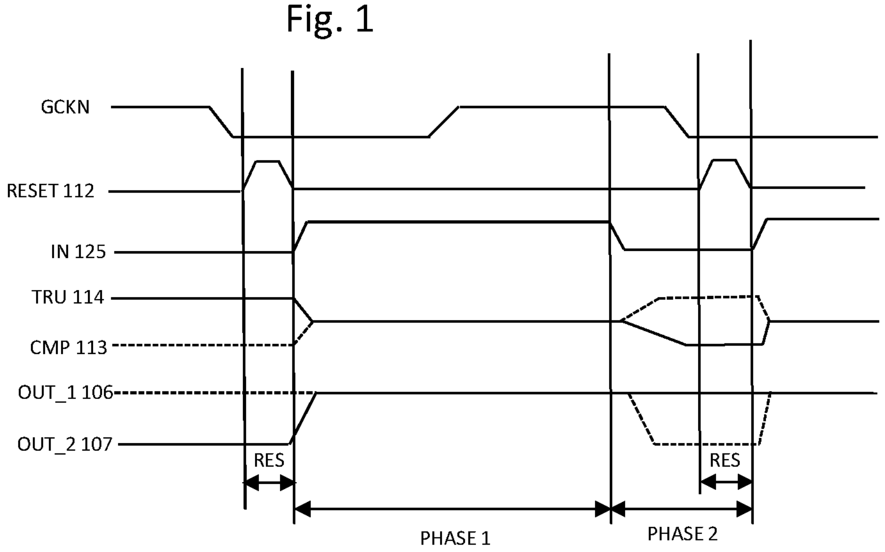
FIG. 2 is a timing diagram associated with a current sense amplifier.
Figures 3, 4:
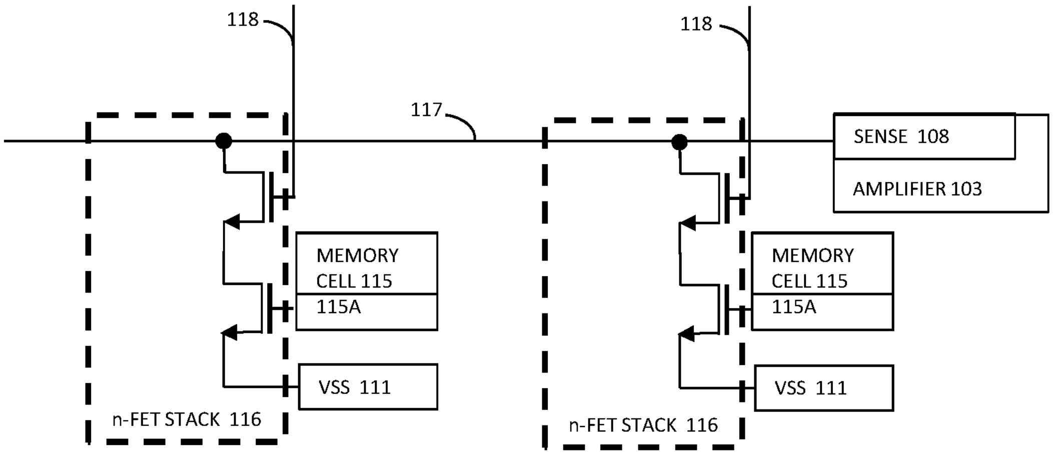
FIG. 3 is a block diagram depicting a truth table associated with a current sense amplifier.
FIG. 4 is a circuit diagram depicting an electronic circuit comprising memory cells and a current sense amplifier.

The functioning of the amplifier depicted in FIG. 1 is illustrated in FIG. 2 and in FIG. 3. FIG. 2 is a timing diagram associated with the amplifier and FIG. 3 depicts a truth table of the amplifier. FIG. 2 illustrates time dependencies of voltages at following terminals and nodes being synchronized with a clock signal (GCKN trace in FIG. 2): the reset input terminal (112) (RESET (112) trace in FIG. 2), the control line input terminal (125) (IN (125) trace in FIG. 2), the TRU (114) node (TRU (144) trace in FIG. 2), the CMP node (113) (CMP (113) trace in FIG. 2), the output terminal (106) (OUT_1 (106) trace in FIG. 2), and the output terminal (107) (OUT_2 trace in FIG. 2).

The operation of the amplifier comprises two phases 1 and 2. In phase 1 a voltage at the control line input terminal is high (logical value "1"). This voltage causes the inverter (102) to generate low voltage (logical value "0") at the input terminals of the NAND gates (100) and (101) coupled to the output terminal of the inverter (102). As a result thereof both of the NAND gates (101) and (101) generate high voltages (logical value "1") and their output terminals. The high voltage at the control line input terminal causes the transmission gate (104) to couple its transmission terminals. As a result thereof the cross coupled inverters are driven out of a latch state, i.e. voltages at the nodes (113) and (114) are equal and may not correspond to either logical value "0" or logical value "1".

However this uncertainty does not affect performance of digital circuitry coupled to the output terminals (106) and (107) because both of the NAND gates (100) and (101) have on their input terminals coupled to the output terminal of the inverter (102) the low voltage corresponding to a logical value "0" and thus the output terminals of NAND gates (100) and (101) are driven to the high voltage corresponding to a logical "1" independent of the voltage levels of nodes CMP (113) and TRU (114). This case corresponds to a row "PHASE 1" of the truth table in the FIG. 3. The logical values of the TRU and CMP nodes are not filled in in this row because the logical values at these nodes are not defined in the phase 1.

In phase 2, a comparison of a reference current flowing through the reference current input terminal (109) and a sense current flowing through sense current input terminal (108). FIG. 2 depicts a match case when the sense current is current is lower than the reference current. In this case a current flowing through the transistors (T3) and (T4) is higher than a current flowing through the transistors (T2) and (T1), i.e. the node TRU (114) is pulled down stronger than the node CMP (113). As a result thereof the cross coupled transistors are driven into a latched state, wherein a low voltage corresponding to logical value "0" is established on the node TRU (114) and the corresponding input terminal of the NAND gate (100) and a high voltage corresponding to logical value "1" is established on the node CMP (113) and the corresponding input terminal of the NAND gate (101).

In the phase 2 a voltage at the control line input terminal is low (logical value "0"). This voltage causes the inverter (102) to generate high voltage (logical value "1") at the input terminals of the NAND gates (100) and (101) coupled to the output terminal of the inverter (102). These logical values at the input terminals of the NAND gates (100) and (101) cause generation of logical values "1" and "0" at the output terminals of the NAND gates (100),(101) and output terminals (106), (107), respectively. This case is illustrated in a row "PHASE 2 MATCH" of the Table depicted on FIG. 3.

The phase 2 may further comprise a reset pulse causing the transistor T5 (or the transmission gate comprising the transistor T5) to couple the sense current input terminal (108) to the ground terminal VSS (111). The reset pulse is generated in a time interval RES depicted on the FIG. 2. This coupling is performed only after the cross coupled inverters are driven into a latched state. In this case the logical values on the output terminals are not disturbed.

A row "PHASE 2 MISS" in the Table depicted on FIG. 3 corresponds to a mismatch case of phase 2 when a reference current flowing through the reference current input terminal (109) is lower than a sense current flowing through sense current input terminal (108). In this case a current flowing through the transistors (T3) and (T4) is lower than a current flowing through the transistors (T2) and (T1), i.e. the node CMP (113) is pulled down stronger than the node TRU (114). As a result thereof the cross coupled transistors are driven into a latched state, wherein a low voltage corresponding to logical value "0" is established on the node CMP (113) and the corresponding input terminal of the NAND gate (101) and a high voltage corresponding to logical value "1" is established on the node TRU (114) and the corresponding input terminal of the NAND gate (100).

In the phase 2 a voltage at the control line input terminal is low (logical value "0"). This voltage causes the inverter (102) to generate high voltage (logical value "1") at the input terminals of the NAND gates (100) and (101) coupled to the output terminal of the inverter (102). These logical values at the input terminals of the NAND gates (100) and (101) cause generation of logical values "0" and "1" at the output terminals of the NAND gates (100),(101) and output terminals (106), (107), respectively.

The amplifier (103) has a number of distinctive advantages. The result of the comparison between the reference current and the sense current is latched, i.e. no specific synchronization is needed for reading data generated by the amplifier. The sense and reference currents are always limited by the electrical resistances of the respective pairs of transistors (T1), (T2) and (T3), (T4) connected in series FIG. 4 illustrates an electronic circuitry comprising the amplifier (103). First output terminals (115A) of memory cells (115) are configured to output logical values stored in the memory cells. The memory cells may be static memory cells. The static memory cells may be but are not limited to six transistor memory cells, eight transistor memory cells, or pairs of cross coupled inverters. Each of the first output terminals is configured to generate a high voltage corresponding to a logical value "1" when a logical value "1" is stored in the memory cell and to generate a low voltage corresponding to a logical value "0" when a logical value "0" is stored in the memory cell.

The first output terminals (115A) are coupled in parallel to the sense current input terminal (108) via a respective first coupling circuitry, each. Each of the first coupling circuitries may be a single n-FET transistor or a first stack of n-FET transistors and configured to couple the sense current input terminal to a ground terminal VSS (111).

For instance the first coupling circuitry may be a single n-FET transistor having a source coupled to the ground terminal VSS (111), a drain coupled to the sense current input terminal, and a gate coupled to the first output terminal (115A) of the respective memory cell (115).

The n-FET transistor is configured to transit in an open state, when the high voltage is generated at the first output terminal of the respective memory cell, and transit into a closed state, when the low voltage is generated at the first output terminal of the respective memory cell. The n-FET transistors may be comprised into a respective n-FET first stack (116), each. The n-FET first stacks may comprise additional n-FET transistors coupled in series.

FIG. 4 depicts an example case when each of the n-FET first stacks (116) comprises two n-FET transistors connected in series. A gate of one of the transistors of each of the first stacks (116) is coupled the first output terminal (115A) of the respective memory cell (115). A gate of another transistor of each of the first stacks (116) is coupled to a respective select line (118). The select lines (118) may be used for masking the data stored in one or more of the memory cells during evaluation of data stored in the one or more of the memory cells (phase 2).

The configuration of circuitry depicted on FIG. 4 may imply criteria on a choice of a value of the reference current generated by the current generator (110) in the phase 2. The current generator has to generate an electrical current being lower than any of the currents flowing through the sense current input terminal when at least one of the first coupling circuitries couples the sense current input terminal to the ground terminal.

Turning back to the example depicted on FIG. 4 the reference current has to be lower than any of currents flowing though one of the n-FET first stacks when all transistors of the n-FET first stack are open. On the other hand the current generator has to generate the reference current higher than a parasitic current flowing through the sense current input terminal when any of the first coupling circuitries do not couple the sense current input terminal to the ground terminal. The parasitic current may be caused by a leakage current of a wiring (117) coupling the first coupling circuitries to the sense current input terminal (108) and/or by parasitic leakage currents of the first coupling circuits themselves.

The aforementioned interval for an allowable reference current may be further reduced by selecting a sub-interval within it as an interval for the allowable reference current. For instance the sub-interval may be reduced to 50% of the aforementioned interval. It may be a lower, top, or central part of the aforementioned interval.

Figure 5:
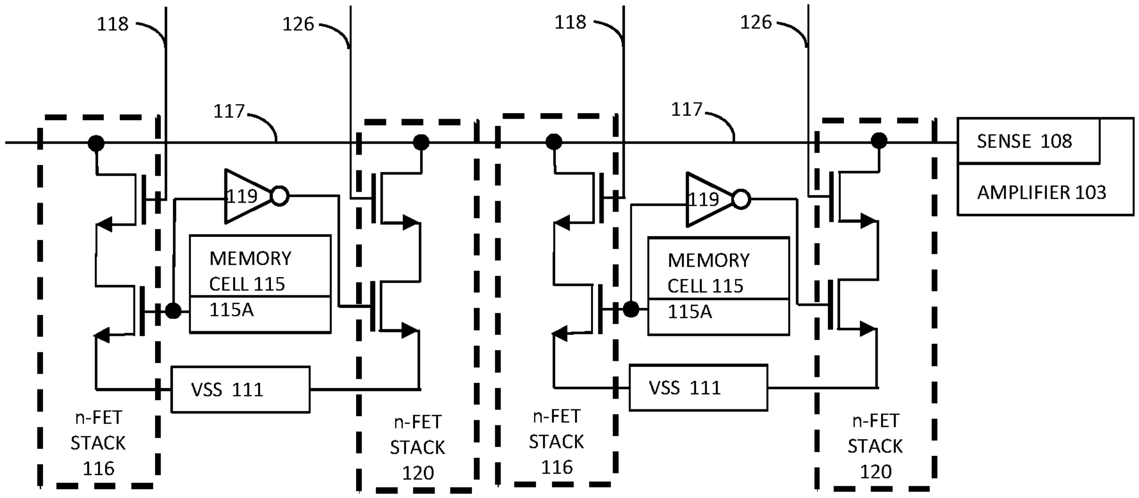
FIG. 5 is a circuit diagram depicting an electronic circuit comprising memory cells and a current sense amplifier.

FIG. 5 illustrates another electronic circuitry comprising the amplifier (103). In comparison with the electronic circuitry depicted in the FIG. 4 the first output terminals (115A) of the memory cells (115) are further coupled via respective inverters (119) and second coupling circuitries (120) to the current sense input terminal, each. The input terminals of the inverters are coupled to the respective first output terminals of the memory cells. The first output terminals of the inverters (119) are coupled to the sense current input terminal via the respective second coupling circuits (120), each.

The functioning of the second coupling circuits (120) is the same as the functioning of the first coupling circuits. Each second coupling circuit may comprise one n-FET transistor or a second stack of n-FET transistors. One of n-FET transistors of each of the second coupling circuits is coupled to the first output terminal of the respective inverter (119). In case when the second coupling circuitry comprises the second n-FET stack, each, a gate of one of transistors of the second n-FET stacks (120) may be coupled to a respective word line (126) as depicted on the FIG. 5.

The select lines (126) may be used for masking data stored in one or more of the memory cells (115) during evaluation of data stored in the one or more memory cells (phase 2). The interval of allowable reference currents may be determined in a similar way as for the electronic circuitry depicted on the FIG. 4, wherein currents flowing through the second coupling circuits are taken in account as well.

Figure 6:
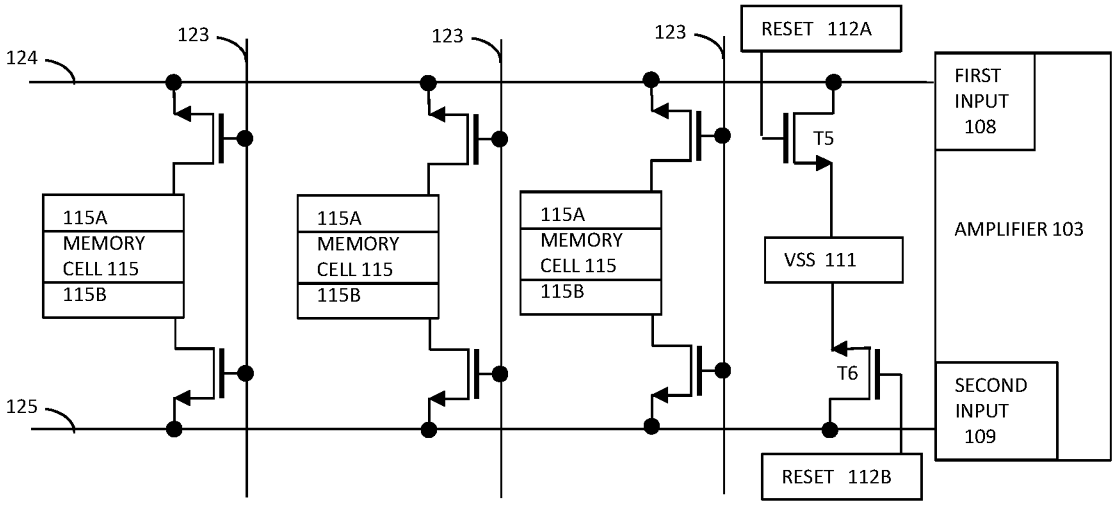
FIG. 6 is a circuit diagram depicting an electronic circuit comprising memory cells and a current sense amplifier.

FIG. 6 illustrates yet another electronic circuitry comprising the amplifier (103). In addition to the memory cells of the electronic circuitries depicted on FIG. 4 and FIG. 5 the memory cells (115) depicted on the FIG. 6 have further second output terminals (115B). The second output terminals are configured to output data stored in the memory cells in an inverted form. For instance, if a logical value “1” is stored in the memory cell (115), then a logical value “1” is generated on the first output terminal (115A) and a logical value “0” is generated on the second output terminal (115B).

Each of the first output terminals (115A) are coupled via a respective transistor to a bit line (124). Each of the first output terminals (115B) are coupled via a respective transistor to a bit line (125). Gates of pairs of transistors coupling the first and the second output terminals of each of the memory cells to the respective bit lines are coupled to a respective select line (123). The bit line (124) is coupled to the first input terminal (108) of the amplifier (103). The bit line (125) is coupled to the second input terminal (109) of the amplifier.

The first input terminal (108) of the amplifier depicted on the FIG. 6 is the sense current input terminal (108) of the amplifier (103) depicted on the FIG. 1. The second input terminal (108) of the amplifier depicted on the FIG. 6 is the reference current input terminal (108) of the amplifier (103) depicted on the FIG. 1.

Instead of using the reference current generator a complimentary logic signal at the second input terminal (109) is used. For instance if a logical value “1” is stored in the memory cell and the respective select line is activated for coupling of the first (115A) and the second (115B) output terminal to the first (108) and second (109) input terminal, the first input terminal is coupled the first output terminal being coupled to power terminal VDD (logical value “1”) and the second input terminal is coupled to the second output terminal being coupled to ground terminal VSS (logical value “0”).

As a result thereof, an electrical current flowing through the second input terminal is higher than an electrical current flowing through the first input terminal. The amplifier (103) can compare these electrical currents and evaluate the logical value stored in the memory cell.

The electronic circuitry depicted on FIG. 6 may further comprise at least one of reset transistors (T5) and (T6). Sources of (T5) and (T6) are coupled to a ground terminal VSS (111). A gate of (T5) is coupled to a terminal RESET (112A) and a gate of (T6) is coupled to a terminal RESET (112B). Terminals RESET (112A) and (112B) may be the same terminals or different terminals. Drains of (T5) and (T6) are coupled to the first (108) and second (109) input terminal, respectively. Transistors (T5) and (T6) of the circuitry depicted on FIG. 6 have the same functionality as transistor (T5) of the circuitry depicted on FIG. 1. Both of transistors (T5) and (T6) depicted on FIG. 6 are open by (respective) reset pulse(s) in the phase two when the cross coupled inverters are latched.

Figure 7:
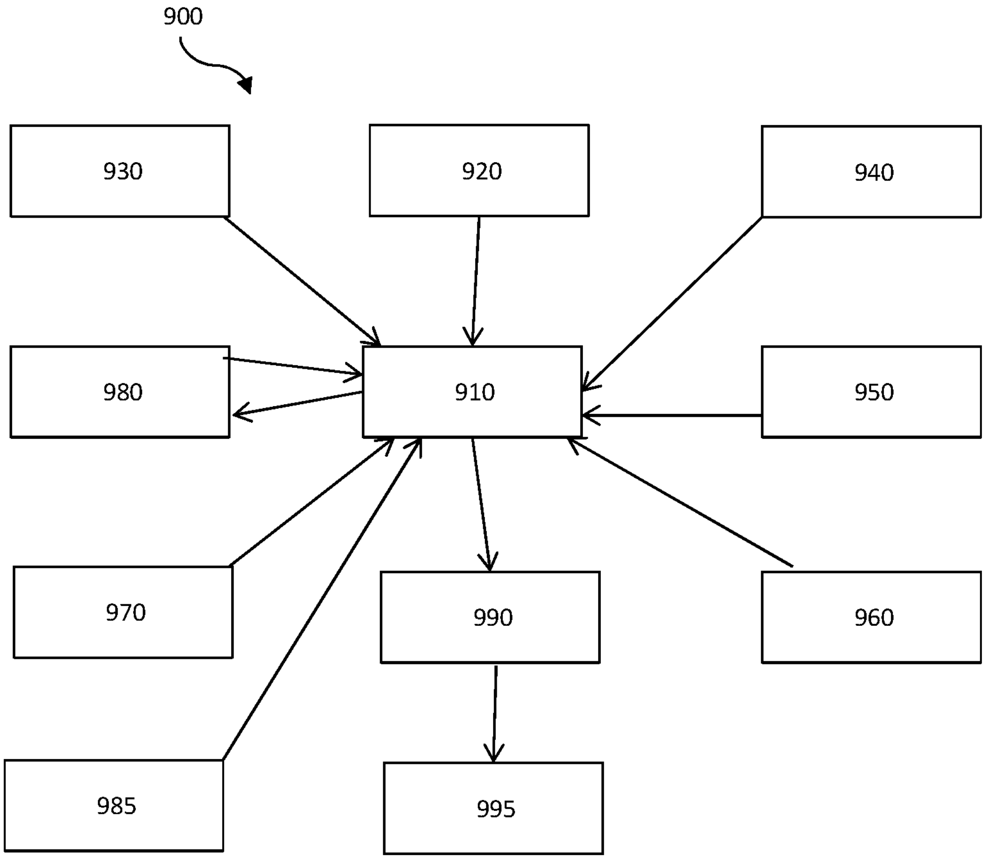
FIG. 7 is a flow diagram depicting a design process used in semiconductor design, manufacture, and/or test.

FIG. 7 is a flow diagram of a design process used in semiconductor design, manufacture, and/or test. FIG. 7 shows a block diagram of an exemplary design flow (900) used for example, in semiconductor IC logic design, simulation, test, layout, and manufacture. Design flow (900) includes processes, machines and/or mechanisms for processing design structures or devices to generate logically or otherwise functionally equivalent representations of the design structures and/or devices described above and shown in FIGS. 1, 4, 5, 6.

The design structures processed and/or generated by design flow (900) may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow (900) may vary depending on the type of representation being designed. For example, a design flow (900) for building an application specific IC (ASIC) may differ from a design flow (900) for designing a standard component or from a design flow (900) for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure (920) that is preferably processed by a design process (910). Design structure (920) may be a logical simulation design structure generated and processed by design process (910) to produce a logically equivalent functional representation of a hardware device. Design structure (920) may also or alternatively comprise data and/or program instructions that when processed by design process (910), generate a functional representation of the physical structure of a hardware device. Whether representing functional and/or structural design features, design structure (920) may be generated using electronic computer-aided design (ECAD) such as implemented by a core developer/designer.

When encoded on a machine-readable data transmission, gate array, or storage medium, design structure (920) may be accessed and processed by one or more hardware and/or software modules within design process (910) to simulate or otherwise functionally represent an electronic component, circuit, electronic or logic module, apparatus, device, or system such as this shown in FIGS. 1, 4, 5, 6. As such, design structure (920) may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process (910) preferably employs and incorporates hardware and/or software modules for synthesizing, translating, or otherwise processing a design/simulation functional equivalent of the components, circuits, devices, or logic structure shown in FIGS. 1, 4, 5, 6 to generate a netlist (980) which may contain design structures such as design structure (920). Netlist (980) may comprise, for example, compiled or otherwise processed data structures representing a list of wires, discrete components, logic gates, control circuits, I/O devices, models, etc. that describes the connections to other elements and circuits in an integrated circuit design. Netlist (980) may be synthesized using an iterative process in which netlist (980) is resynthesized one or more times depending on design specifications and parameters for the device.

As with other design structure types described herein, netlist (980) may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process (910) may include hardware and software modules for processing a variety of input data structure types including netlist (980). Such data structure types may reside, for example, within library elements (930) and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications (940), characterization data (950), verification data (960), design rules (970), and test data files (985) which may include input test patterns, output test results, and other testing information.

Design process (910) may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process (910) without deviating from the scope and spirit of the embodiments. Design process (910) may also include modules for performing standard circuit design processes such as timing analysis, verification, design rule checking, place and route operations, etc.

Design process (910) employs and incorporates logic and physical design tools such as HDL compilers and simulation model build tools to process design structure (920) together with some or all of the depicted supporting data structures along with any additional mechanical design or data (if applicable), to generate a second design structure (990).

Design structure (990) resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure (920), design structure (990) preferably comprises one or more files, data structures, or other computer-encoded data or instructions that reside on transmission or data storage media and that when processed by an ECAD system generate a logically or otherwise functionally equivalent form of one or more of the embodiments shown in FIGS. 1, 4, 5, 6. In one embodiment, design structure (990) may comprise a compiled, executable HDL simulation model that functionally simulates the devices shown in FIGS. 1, 4, 5, 6.

Design structure (990) may also employ a data format used for the exchange of layout data of integrated circuits and/or symbolic data format (e.g. information stored in a GDSII (GDS2), GL1, OASIS, map files, or any other suitable format for storing such design data structures). Design structure (990) may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 4, 5, 6. Design structure (990) may then proceed to a stage (995) where, for example, design structure (990): proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the embodiments. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principals of the embodiments and the practical application, and to enable others of ordinary skill in the art to understand the various embodiments with various modifications as are suited to the particular use contemplated. Accordingly, while the embodiments have been described in terms of embodiments, those of skill in the art will recognize that the embodiments can be practiced with modifications and in the spirit and scope of the appended claims.

What is claimed is:

1. A current sense amplifier comprising:
- a first cross coupled inverter coupled to a sense current input terminal;
- a second cross coupled inverter coupled to a reference current input terminal;
- a first amplifier output terminal coupled to the first cross coupled inverter;
- a first NAND gate coupled to the first cross coupled inverter and the first amplifier output terminal;
- a second amplifier output terminal coupled to the second cross coupled inverter;
- a second NAND gate coupled to the second cross coupled inverter and the second amplifier output terminal; and
- a control line input terminal coupled to the first cross coupled inverter and the second cross coupled inverter, wherein the first and second NAND gates facilitate generating an output at the first and second amplifier output terminals at least partially as a function of a control line input.

2. The amplifier of claim 1, further comprising a transmission gate coupled to the control line input terminal and the first and second cross coupled inverters.

3. The amplifier of claim 2, wherein the transmission gate comprises a first transmission terminal coupled to the first cross coupled inverter and a second transmission terminal coupled to the second cross coupled inverter, the transmission gate terminals configured for on/off switching of the couplings between the transmission gate terminals and the associated cross coupled inverters.

4. The amplifier of claim 1, wherein in an unlatched state the first output at the first amplifier output terminal and the second output at the second amplifier output terminal are equal.

5. The amplifier of claim 1, further comprising:
- a control line inverter coupled to the control line input terminal and the first and second NAND gates.

6. The amplifier of claim 1, further comprising a reset device coupled to the sense current input terminal, the reset device to shift the first and second cross coupled inverters from a latched state to an unlatched state.

7. The amplifier of claim 1, wherein:
- the sense current input terminal is coupled to at least one memory cell of an electronic circuit operatively coupled to the amplifier; and
- the reference current input terminal is coupled to a reference source.

8. The amplifier of claim 7, wherein in a latched state, the outputs of the first and second amplifier output terminals at least partially define the contents of the at least one memory cell.

9. An electronic circuit, comprising:
- a current sense amplifier comprising:
  - a first cross coupled inverter coupled to a sense current input terminal;
  - a second cross coupled inverter coupled to a reference current input terminal;
  - a first amplifier output terminal coupled to the first cross coupled inverter;
- a first NAND gate coupled to the first cross coupled inverter and the first amplifier output terminal;
  - a second amplifier output terminal coupled to the second cross coupled inverter;
  - a second NAND gate coupled to the second cross coupled inverter and the second amplifier output terminal; and a control line input terminal coupled to the first cross coupled inverter and the second cross coupled inverter, wherein the first and second NAND gates facilitate generating an output at the first and second amplifier output terminals at least partially as a function of a control line input; and one or more static memory cells, each of the static memory cells comprising a first data output operatively coupled to the current sense amplifier, each first data output configured for outputting data stored in the respective memory cell.

10. The electronic circuit of claim 9, wherein the current sense amplifier further comprising a transmission gate coupled to the control line input terminal and the first and second cross coupled inverters.

11. The electronic circuit of claim 10, wherein the transmission gate comprises a first transmission terminal coupled to the first cross coupled inverter and a second transmission terminal coupled to the second cross coupled inverter, the transmission gate terminals configured for on/off switching of the couplings between the transmission gate terminals and the associated cross coupled inverters.

12. The electronic circuit of claim 9, wherein in an unlatched state the first output at the first amplifier output terminal and the second output at the second amplifier output terminal are equal.

13. The electronic circuit of claim 9, wherein the current sense amplifier further comprising:

a control line inverter coupled to the control line input terminal and the first and second NAND gates.

14. The electronic circuit of claim 9, wherein the current sense amplifier further comprising a reset device coupled to the sense current input terminal, the reset device to shift the first and second cross coupled inverters from an latched state to an unlatched state.

15. The electronic circuit of claim 9, wherein the reference current input terminal is coupled to a reference source.

16. The electronic circuit of claim 9, wherein in a latched state, the outputs of the first and second amplifier output terminals at least partially define the contents of the one or more static memory cells.

17. The amplifier of claim 1, further comprising the control line input to shift the first and second cross coupled inverters from an unlatched state to a latched state, wherein in the latched state:

the first cross coupled inverter to measure a first current transmitted through the sense current input terminal;

the second cross coupled inverter to measure a second current transmitted through the reference current input terminal; and the first and second cross coupled inverters to compare the first and second currents, the comparison generating a first output at the first amplifier output terminal and an inverted second output at the second amplifier output terminal.

18. The electronic circuit of claim 9, further comprising the control line input to shift the first and second cross coupled inverters from an unlatched state to a latched state, wherein in the latched state:

the first cross coupled inverter to measure current transmitted through the sense current input terminal;

the second cross coupled inverter to measure current transmitted through the reference current input terminal; and the first and second cross coupled inverters to compare the two currents, the comparison of the currents generating a first output at the first amplifier output terminal and an inverted second output at the second amplifier output terminal.

* * * * *